United States Patent
Jung

(10) Patent No.: US 7,027,352 B2
(45) Date of Patent: Apr. 11, 2006

(54) DELAY LOCKED LOOP (DLL) IN SEMICONDUCTOR DEVICE

(75) Inventor: Hea-Suk Jung, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 11 days.

(21) Appl. No.: 10/635,740

(22) Filed: Aug. 5, 2003

(65) Prior Publication Data

US 2004/0099883 A1    May 27, 2004

(30) Foreign Application Priority Data

Nov. 27, 2002   (KR) .................... 10-2002-0074229

(51) Int. Cl.
*G11C 8/00* (2006.01)

(52) U.S. Cl. ..................... 365/233; 365/194

(58) Field of Classification Search ............... 365/233, 365/194, 230.01, 189.12, 189.08, 195
See application file for complete search history.

(56) References Cited

U.S. PATENT DOCUMENTS

| | | | |
|---|---|---|---|
| 6,075,395 A | 6/2000 | Saeki | |
| 6,150,859 A * | 11/2000 | Park | 327/158 |
| 6,172,537 B1 * | 1/2001 | Kanou et al. | 327/99 |
| 6,205,062 B1 | 3/2001 | Kim et al. | |
| 6,301,191 B1 * | 10/2001 | Ooishi | 365/233 |
| 6,492,852 B1 | 12/2002 | Fiscus | |
| 6,552,955 B1 | 4/2003 | Miki | |
| 6,768,690 B1 * | 7/2004 | Kwon et al. | 365/194 |
| 2003/0001637 A1 | 1/2003 | Jung | |
| 2003/0030473 A1 * | 2/2003 | Lee | 327/158 |
| 2003/0081491 A1 | 5/2003 | Miki | |
| 2003/0085744 A1 | 5/2003 | Heo et al. | |

FOREIGN PATENT DOCUMENTS

| | | |
|---|---|---|
| JP | 11-072540 | 3/1999 |
| JP | 11-214986 | 8/1999 |
| JP | 11-259167 | 9/1999 |
| JP | 2000-100163 | 4/2000 |
| JP | 2001-283589 | 10/2001 |
| KR | 2001-64117 | 7/2001 |

* cited by examiner

*Primary Examiner*—Thong Q. Le
(74) *Attorney, Agent, or Firm*—Blakely Sokoloff Taylor & Zafman

(57) ABSTRACT

A delay locked loop (DLL) in a semiconductor device, includes an clock buffer receiving an external clock signal and an inverted clock signal and outputting first and second internal clock signals to be used in the DLL circuit; and a variable clock divider receiving the second internal signal from the clock buffer and variably dividing the second internal clock signal to have a predetermined pulse width according to a control signal based on a column address strobe (CAS) latency, which is set according to a frequency of the external clock signal, wherein the control signal is initially set to have a first logic level and is enabled to a second logic level when the CAS latency corresponds to a high frequency.

6 Claims, 11 Drawing Sheets

DELAY LOCKED LOOP (DLL) IN SEMICONDUCTOR DEVICE

FIELD OF THE INVENTION

The present invention relates to a semiconductor device; and, more particularly, to a delay locked loop having a variable clock divider to be applied to high and low frequencies by using a column address strobe (CAS) latency in the semiconductor device.

DESCRIPTION OF RELATED ART

Generally, a clock signal is employed to set a timing reference and secure a rapid operation without any error in a system or a circuit. At this time, a time delay is generated when the clock signal provided from the external circuit is used in an internal circuit. The time delay is adjusted by a delay locked loop (DLL) circuit to have an identical phase between the external clock signal and the internal clock signal.

FIG. 1 is a block diagram illustrating a conventional DLL circuit. The DLL circuit includes a clock buffer 110, a clock divider 120, a phase comparator 130, a shift controller 140, a shift register 150, a plurality of delay lines 161, 162 and 163, a delay model unit 170 and a plurality of DLL drivers 181 and 182.

The clock buffer 110 receives a external clock signal and an inverted clock signal CLK and /CLK and outputs internal clock signals Fall_clk and Rise_clk. The clock divider 120 outputs a divided signal Delay_in having a predetermined pulse width per eight periods of the internal clock signal and a reference signal ref inverting the divided signal Rise_clk by receiving the internal clock signal Rise_clk. The phase comparator 130 compares phases between the reference signal ref and a feedback signal and outputs a comparison signal Pc<0:3>, and the shift controller 140 generates shift control signals SR and SL by receiving the comparison signal Pc<0:3> from the phase comparator 130. The shift register 150 receives the shift control signals SR and SL and selects delay position of the delay lines. The plurality of delay lines 161 to 163, each including a plurality of unit delays, outputs a plurality of delayed signals ifclk and irclk by delaying the internal clock signals Fall_clk and Rise_clk according to outputs of the shift register 150 and a delayed feedback delaying the divided signal Delay_in. The delay model unit 170 generates a feedback signal compensating a time delay of the internal clock signal compared with the external. The plurality of DLL drivers 181 and 182 transmit the plurality of delayed clock signal ifclk and irclk to an internal circuit.

The DLL circuit repeatedly compares a rising edge of the reference signal with that of the feedback signal and, when a jitter between the rising edge of the reference signal and that of the feedback signal is minimized, delay is locked. Therefore, the time difference between the external clock signal and the internal clock signal is compensated, so that the delayed clock signals ifclk and irclk are synchronized with the external clock signals /CLK and CLK.

FIG. 2 is a timing diagram showing an operation for a low frequency in the conventional DLL circuit.

As shown, the clock divider 120 outputs the divided signal Delay_in having a predetermined pulse width (1 tck, herein, 1 tck corresponds to one period of the clock signal) per eight periods of the internal clock signal Rise_clk and the reference signal ref inverting the divided signal Rise_clk by receiving the internal clock signal Rise_clk. The feedback signal, which is generated by passing the divided signal Delay_in trough the delay line 163 and the delay model unit 170, is compared with the reference signal ref to thereby reduce a time delay therebetween. The divided clock signal Delay_in is initially delayed as much as a unit delay (for example, about 0.2 ns) to thereby be the delayed feedback signal feedback_dly1. The feedback signal feedback_dly1 is inputted to the delay model for compensating a time delay between the external clock signal and the internal clock signal, so that the feedback signal is generated. The feedback signal Feedback is delayed as much as about 5 ns compared with the delayed feedback signal Feedback_dly1. Namely, the delay model unit 170 has a delay of about 5 ns. Since the divided signal delay_in initially passes the delay line 163 having the delay of about 0.2 ns and the delay model unit 170 having the delay of about 5 ns, a time difference (Td) between the rising time of the divided signal Delay_in and the rising time of the feedback signal Feedback becomes about 5.2 ns. In a low frequency (for example, tck≧10 ns), the rising edge of the feedback signal Feedback comes before the rising edge of the reference signal ref, which is risen after the predetermined time (1 tck) since the divided signal Delay_in is risen. At this case, the phase comparator 130 generates the comparison signal to increase the number of unit delays, so that a delay of the feedback signal Feedback is adjusted to match an rising edge of the feedback signal Feedback with that of the reference signal ref.

FIG. 3 is a timing diagram showing an operation for a high frequency of the clock divider 120 in the conventional DLL circuit.

As shown, at the high frequency (for example, tck≦5 ns), since the initial divided signal delay_in is passed to the unit delay having the delay of about 0.2 ns and the delay model unit having the delay of about 5 ns, the rising edge of the feedback signal Feedback comes after the rising edge of the reference signal ref. At this case, the phase comparator 130 generates a comparison signal to decrease the number of unit delays, that is, carry out a shift-left operation. However, since the delay lines 16 to 163 cannot be initially shift left, a desired internal clock cannot be obtained.

To solve the above problem, a clock dividing method is introduced as illustrated in FIG. 4.

Referring to FIG. 4, the internal clock signal Rise_clk is divided to generate a divided signal Delay_in having a predetermined pulse width (2 tck) per eight periods of the internal clock signal and a reference signal ref inverting the divided signal Delay_in. Namely, the rising edge of the reference signal ref comes after 2 tck since the divided signal delay_in is risen. The divided signal delay_in is initially passed to the unit delay having a delay of about 0.2 ns and the delay model unit having a delay of about 5 ns to thereby generate the feedback signal Feedback. Thus, the feedback signal Feedback is delayed as much as about 5.2 ns. Since the rising edge of the reference signal ref comes after 2 tck (=10 ns) since the divided signal delay_in is risen, the rising edge of the feedback signal Feedback comes before that of the reference signal ref. Thereafter, the phase comparator 130 generates a comparison signal to increase the number of unit delays, that is, carry out a shift-right operation, so that the rising edge of the feedback signal Feedback is matched with the rising edge of the reference signal ref.

FIG. 5 is a circuit diagram showing a conventional ⅛ clock divider. The clocks divider includes a plurality of dividers 510, 520 and 530, and a driver 540.

FIG. 6 is a timing diagram illustrating an operation of the convention ⅛ clock divider in FIG. 5.

Referring to FIG. 6, a first divider 510 receives a clock signal S1 having a predetermine period (tck) and generates a divided signal A toggled with a 2×tck period by inverting a phase of the signal S1 when the signal S1 becomes a second logic level (high) and latching a value when the signal S1 becomes a first logic level (low). Thereafter, the second divider 520 receives the divided signal A from the first divider 510 and generates a ¼ divided signal B having a predetermined pulse width (1 tck) by inverting a phase when the divided signal A becomes a second logic level (high) and maintaining a value when the divided signal A is a first logic level (low). Next, a third divider 530 receives the ¼ divided signal B and generates a ⅛ divided signal S3 having a predetermined pulse width (1 tck) per eight periods of the clock signal S1. The above mentioned clock divider is suitable only for a low frequency. An inverted ⅛ divided signal S2 is outputted through the driver 540.

FIG. 7 is a circuit diagram illustrating a conventional ⅖ clock divider. The ⅖ clock divider includes a plurality of dividers 710, 720 and 730, and a driver 740.

FIG. 8 is a timing diagram illustrating an operation of the convention ⅖ clock divider in FIG. 5.

Referring to FIG. 8, a first divider 710 receives a clock signal S1 having a predetermine period (tck) and generates a divided signal A toggled with a 2×tck period by inverting a phase of the signal S1 when the signal S1 becomes a second logic level (high) and latching a value when the signal S1 becomes a first logic level (low). Thereafter, the second divider 720 receives the divided signal A from the first divider 710 and generates a ¾ divided signal B having a predetermined pulse width (2 tck) by inverting a phase when the divided signal A becomes a second logic level (high) and maintaining a value when the divided signal A is a first logic level (low). Next, a third divider 730 receives the ¾ divided signal B and generates a ⅖ divided signal S3 having a predetermined pulse width (2 tck) per eight periods of the clock signal S1. An inverted ⅖ divided signal S2 is outputted through the driver 740. The above mentioned clock divider can be used for a high frequency.

However, if the conventional DLL circuit having the ⅛ clock divider is used, the DLL circuit cannot be used for the high frequency, and, if the convention DLL circuit having the ⅖ clock divider is used, since the reference signal has a pulse width of 2 tck, there is a problem that it takes a long time to achieve a delay locking in a low frequency due to a long rising time difference between the reference signal and the feedback signal Feedback. Also, if the ⅖ clock divider is used in a low frequency, since it causes that the number of unit delays have to be increased so as to achieve a delay locking, there is a problem that a layout area of the DLL circuit is increased.

SUMMARY OF THE INVENTION

It is, therefore, an object of the present invention to provide a delay locked loop (DLL) circuit having a variable clock divider to be applied to high and low frequencies.

In accordance with an aspect of the present invention, there is provided a delay locked loop (DLL) in a semiconductor device, including: an clock buffer receiving an external clock signal and an inverted clock signal and outputting first and second internal clock signals to be used in the DLL circuit; and a variable clock divider receiving the second internal signal from the clock buffer and variably dividing the second internal clock signal to have a predetermined pulse width according to a control signal based on a column address strobe (CAS) latency, which is set according to a frequency of the external clock signal, wherein the control signal is initially set to have a first logic level and is enabled to a second logic level when the CAS latency corresponds to a high frequency.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a DLL circuit having a controller for selecting a divider suitable for a random frequency according to the present invention will be described in detail referring to the accompanying drawings.

Figure 1:
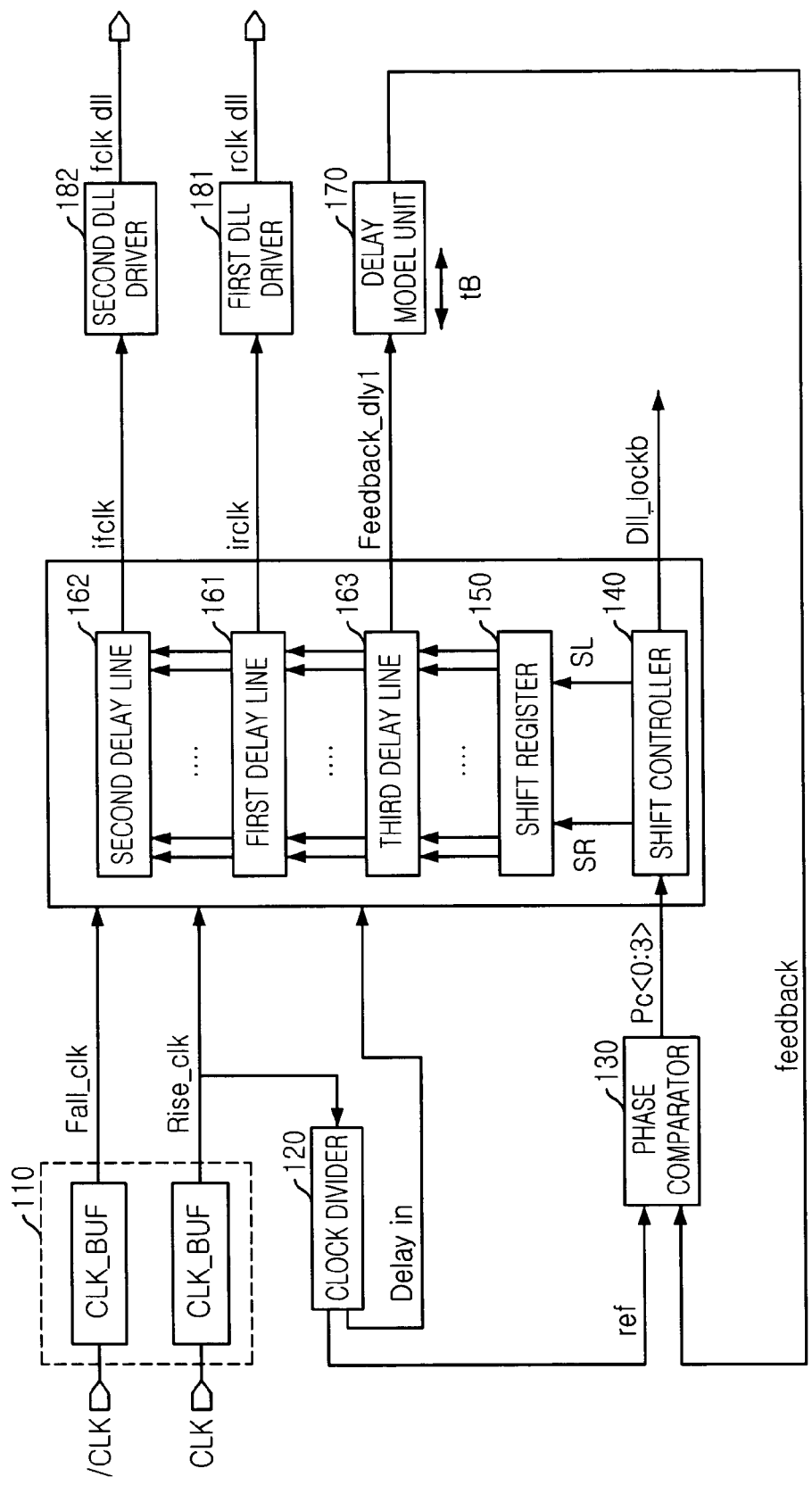
FIG. 1 is a block diagram illustrating a conventional DLL circuit.
Figure 2:
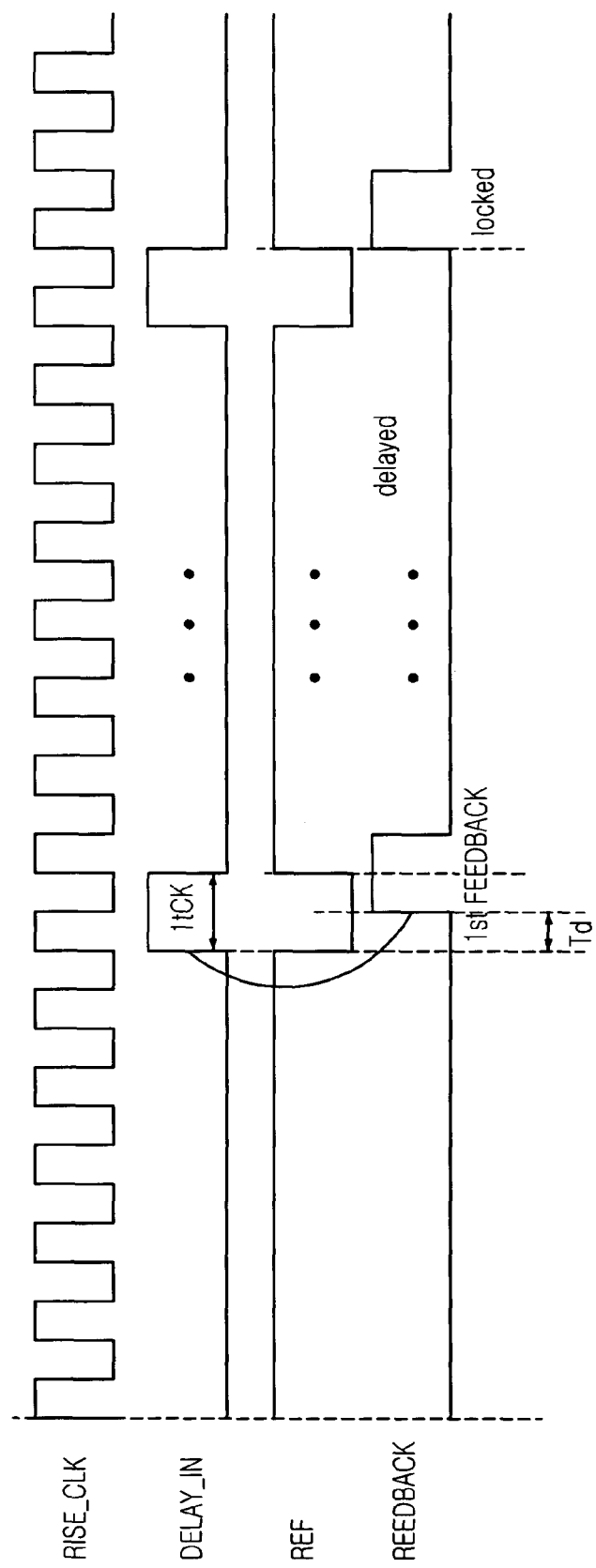
FIG. 2 is a timing diagram showing an operation for a low frequency in the conventional DLL circuit.
Figure 3:
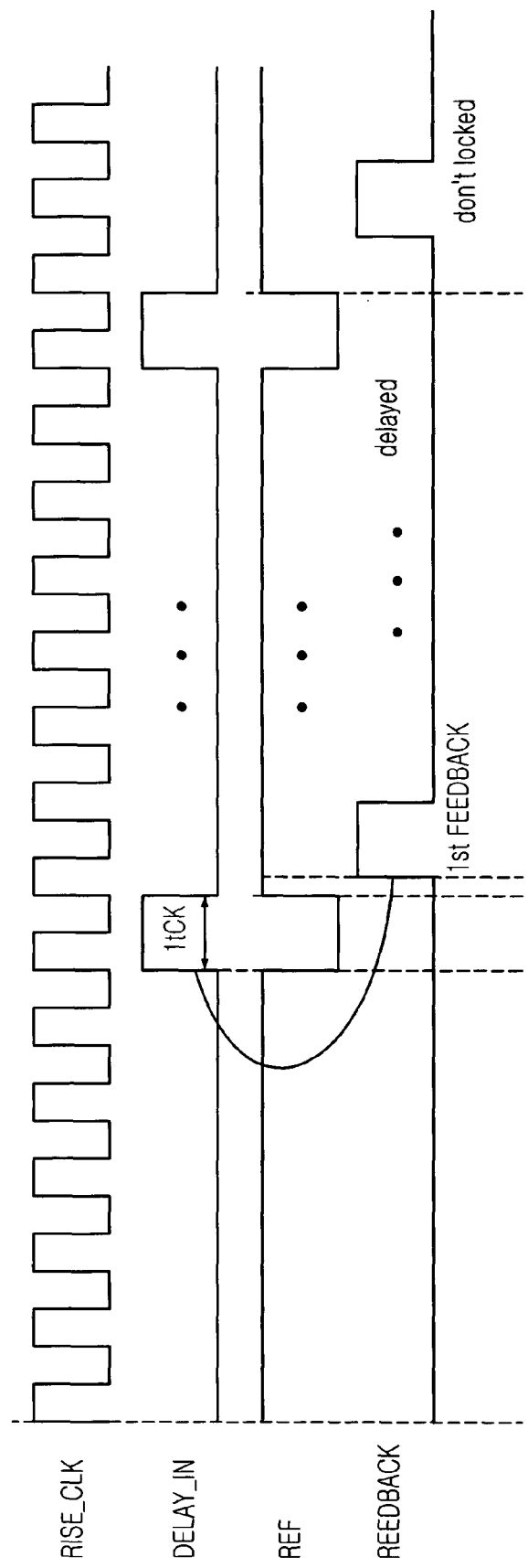
FIG. 3 is a timing diagram showing an operation that a delay is not locked for a high frequency of the clock divider in the conventional DLL circuit.
Figure 4:
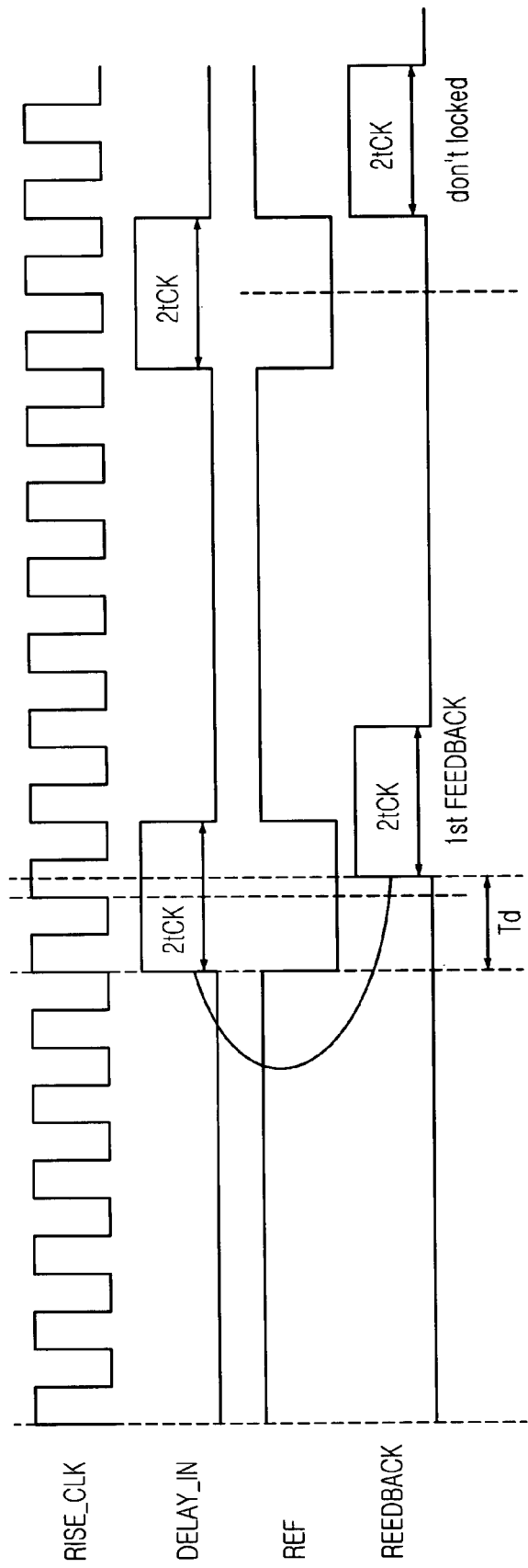
FIG. 4 is a timing diagram showing an operation for a high frequency of the clock divider in the conventional DLL circuit.
Figure 5:
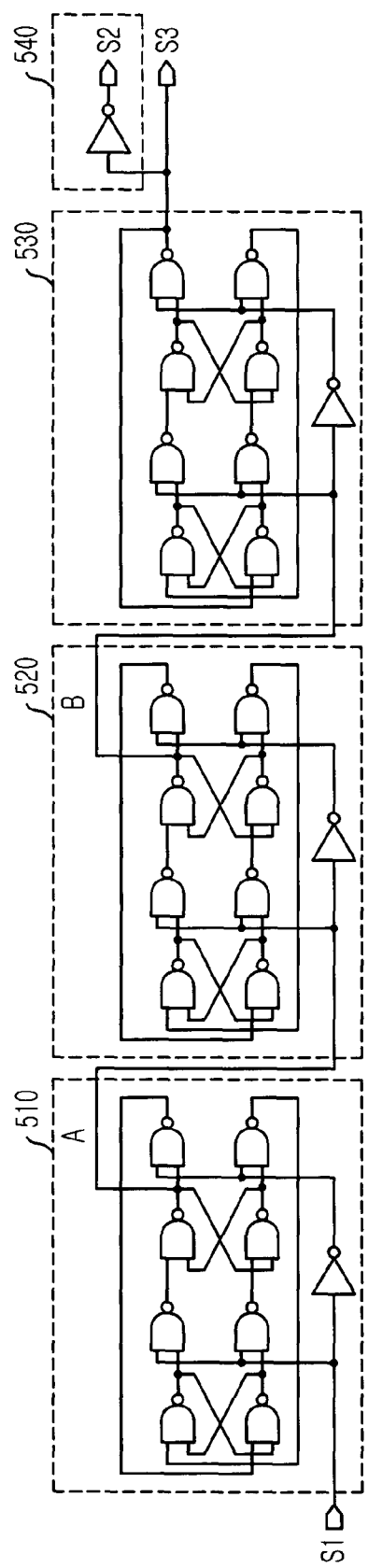
FIG. 5 is a circuit diagram showing a conventional ⅛ clock divider.
Figure 6:
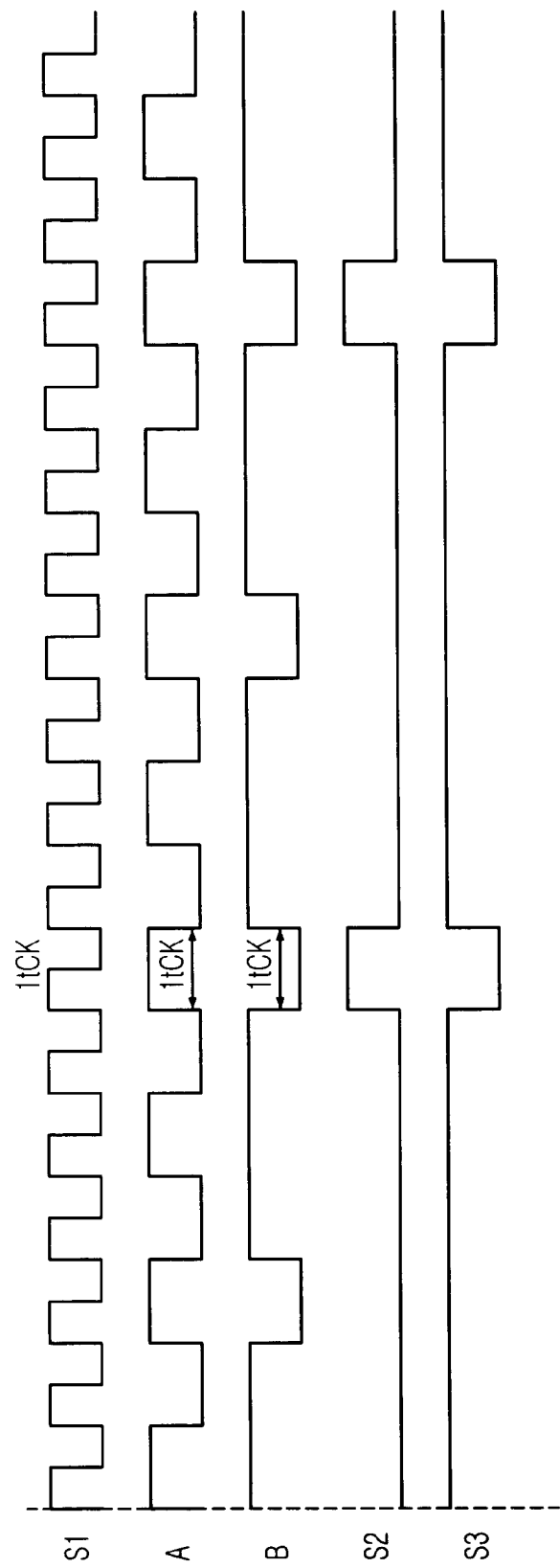
FIG. 6 is a timing diagram illustrating an operation of the convention ⅛ clock divider in FIG. 5.
Figure 7:
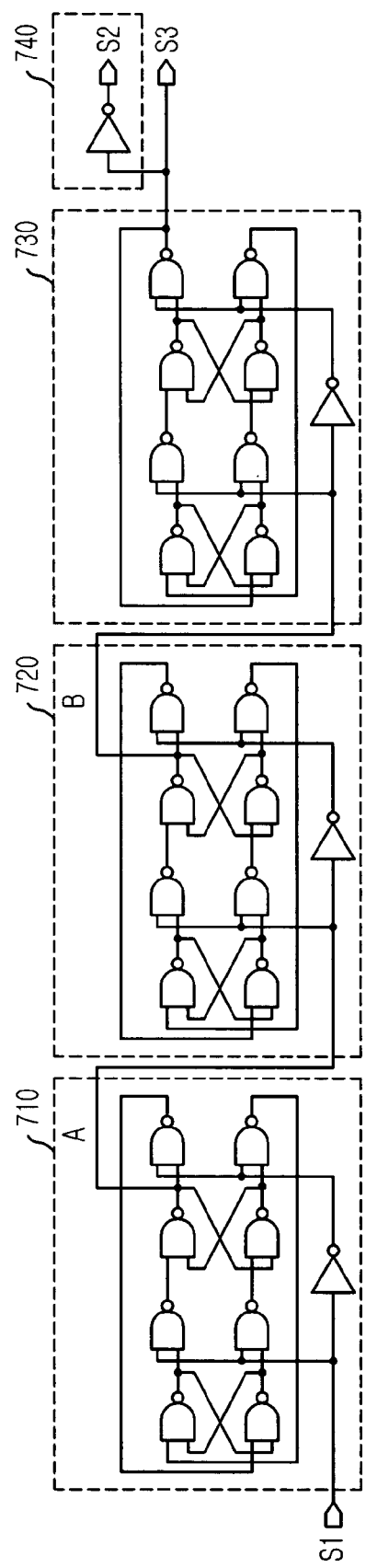
FIG. 7 is a circuit diagram illustrating a conventional ⅖ clock divider.
Figure 8:
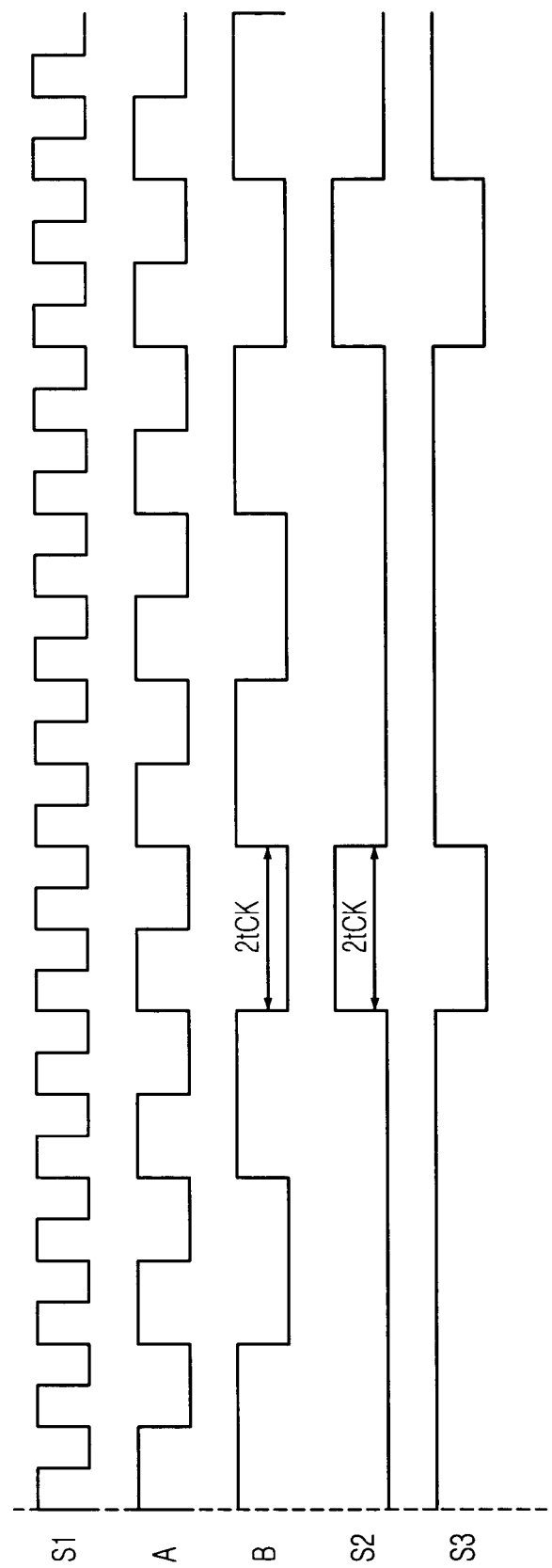
FIG. 8 is a timing diagram illustrating an operation of the convention ⅖ clock divider in FIG. 5.
Figure 9:
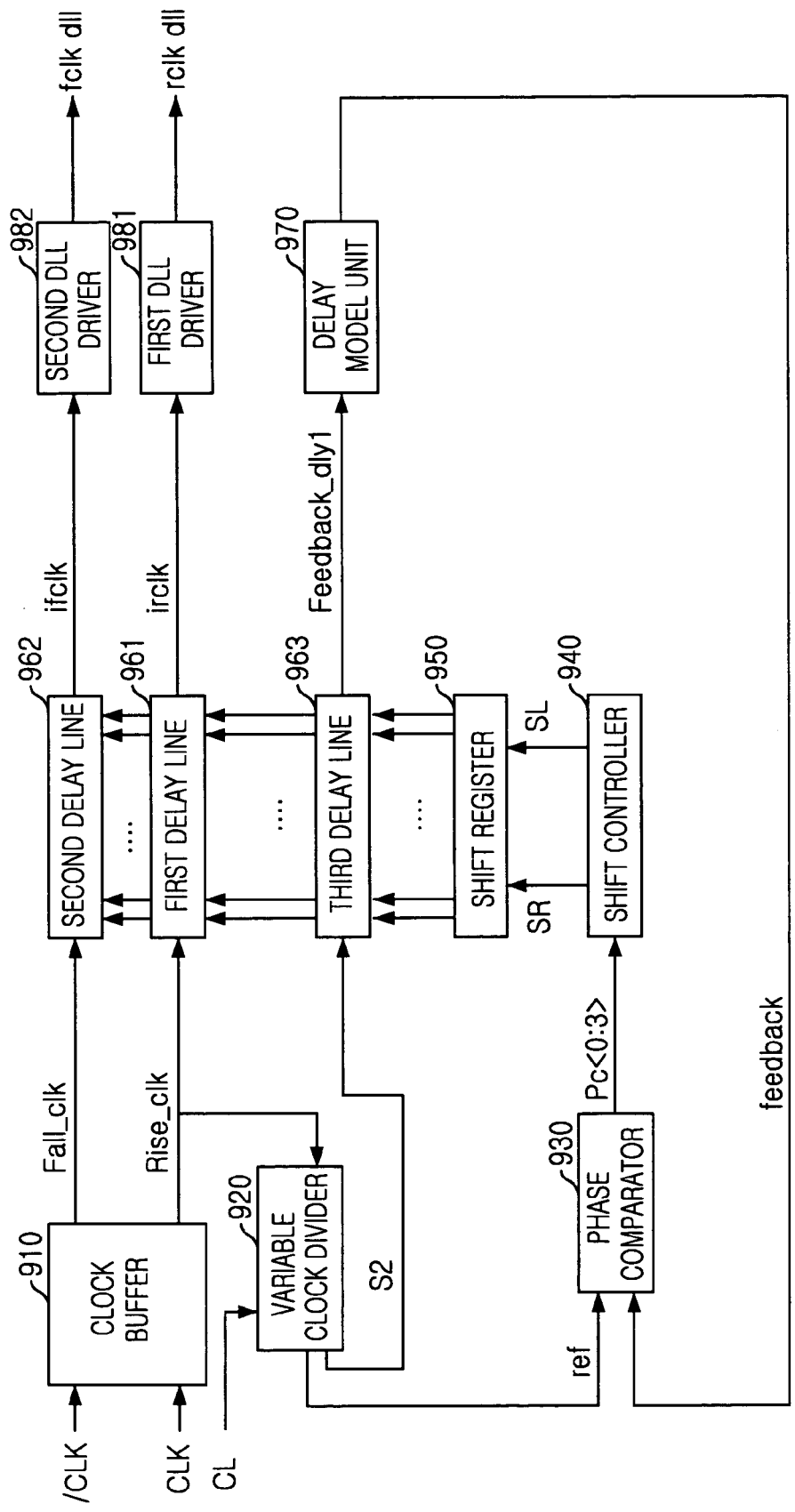
FIG. 9 is a block diagram illustrating a DLL circuit in accordance with the preferred embodiment of the present invention.

FIG. 9 is a block diagram illustrating a DLL circuit in accordance with the preferred embodiment of the present invention. The DLL circuit includes a clock buffer 910, a variable clock divider 920, a phase comparator 930, a shift controller 940, a shift register 950, a plurality of delay lines 961, 962 and 963, a delay model unit 970 and a plurality of DLL drivers 981 and 982.

The clock buffer 910 receives an external clock signal and an inverted clock signal CLK and /CLK and outputs internal clock signals Fall_clk and Rise_clk.

The variable clock divider 920 receives the internal clock signal Rise_clk and a control signal CL based on a column address strobe (CAS) latency, which is set according to a frequency of the external clock signal, wherein the control signal is initially set to have a first logic level (low) and is enabled to a second logic level (high) when the CAS latency corresponds to a high frequency, and outputs a divided signal S2 having a predetermined pulse width and an reference signal S3 inverting the divided signal S2 according to the control signal CL.

The phase comparator 930 receives the feedback signal and the reference signal S3 from the delay model unit 970 and the variable clock divider 920, and compares rising edges therebetween to thereby generate a comparison signal Pc<0:3>. The comparison signal Pc<0:3> is outputted to the shift register controller 940.

The shift controller 940 generates shift control signals SR and SL by receiving the comparison signal Pc<0:3> from the phase comparator 930. The shift register 950 receives the shift control signals SR and SL and selects delay position of the delay lines. If the shift right signal SR of the shift control signals is inputted to the shift register, an activation position of the delay line is moved to right, and if the shift left signal SL of the shift control signals is inputted to the shift register, an activation position of the delay line is moved to left. The plurality of delay lines 961 to 963, each including a plurality of unit delays, outputs a plurality of delayed signals ifclk and irclk by delaying the internal clock signals Fall_clk and Rise_clk according to outputs of the shift register 950 and a delayed feedback signal Feedback_dly1 by delaying the divided signal Delay_in outputted from the variable clock divider 920.

The delay model unit 970 generates a feedback signal compensating a time delay of the internal clock signal compared with the external. The plurality of DLL drivers 981 and 982 transmit the plurality of delayed clock signal ifclk and irclk to an internal circuit.

Figure 10:
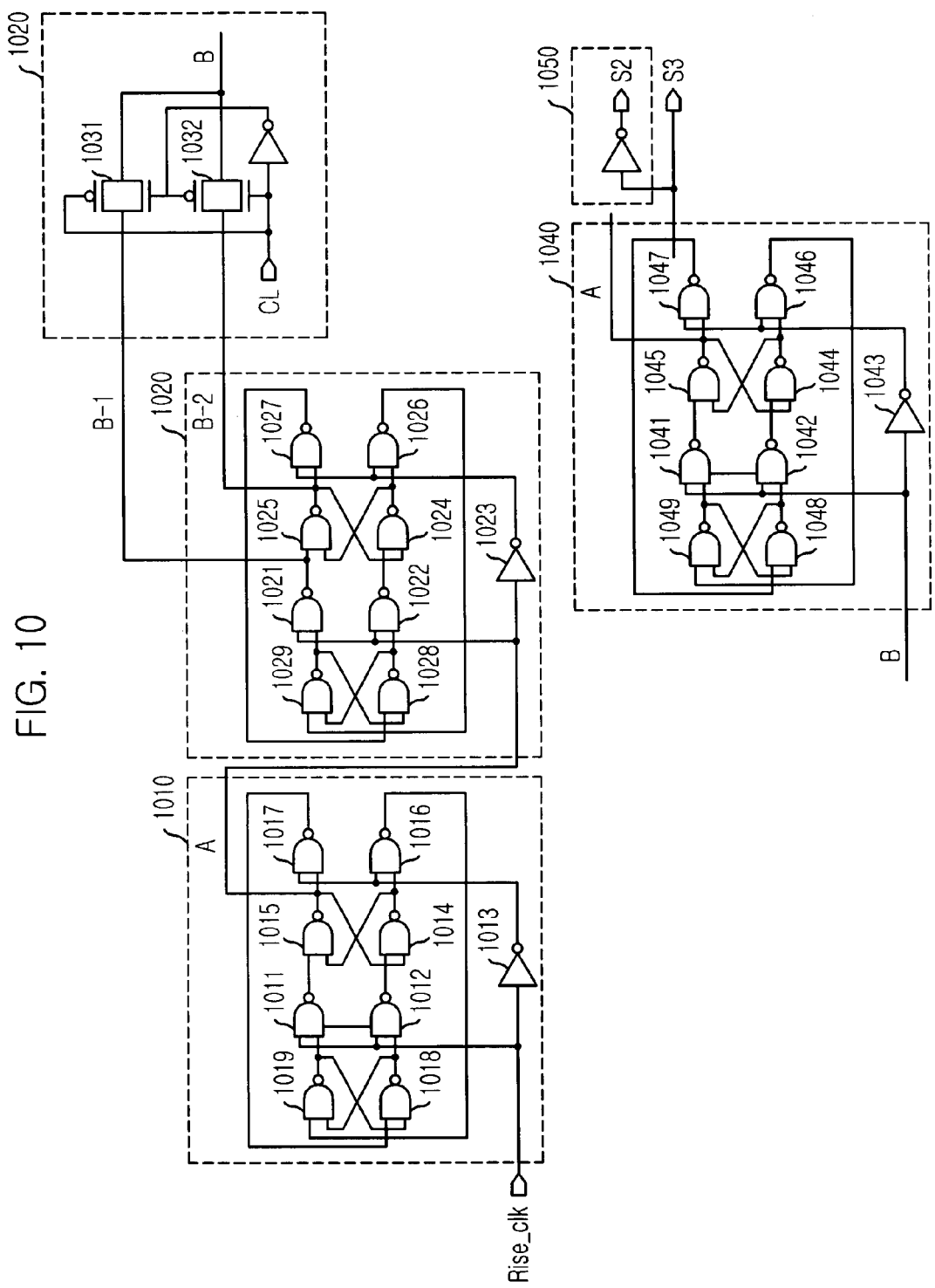
FIG. 10 is a circuit diagram showing the variable clock divider 920 in accordance with the preferred embodiment of the present invention.

FIG. 10 is a circuit diagram showing the variable clock divider 920 in accordance with the preferred embodiment of the present invention.

A first divider 1010 receives the second internal clock signal Rise_clk form the clock buffer 910 and generates a first divided signal A by inverting a signal logic level when the second internal clock signal Rise_clk is a second logic level (high) and maintaining a latched value when the second internal clock signal Rise_clk is a first logic level (low). The first divided signal A is outputted to a second divider 1020.

An operation of the first divider 1010 will be described in detail.

A $1^{st}$ NAND gate 1011 in the first divider 1010 performs a NAND operation by receiving the second internal clock signal Rise_clk and a $2^{nd}$ NAND gate 1012 in the first divider 1010 performs a NAND operation by receiving the second internal clock signal Rise_clk. A $1^{st}$ inverter 1013 inverts the second internal clock signal Rise_clk and a $3^{rd}$ NAND gate 1014 performs a NAND operation by receiving an output signal of the $2^{nd}$ NAND gate 1012.

A $4^{th}$ NAND gate 1015, which is cross-coupled with the $3^{rd}$ NAND gate 1014, outputs the first divided signal A by performing a NAND operation for an output signal of the $1^{st}$ NAND gate 1011, and a $5^{th}$ NAND gate 1016 performs a NAND operation by receiving output signals of the $3^{rd}$ NAND gate 1014 and the $1^{st}$ inverter 1013. A $6^{th}$ NAND gate 1017 performs a NAND operation by receiving output signals of the $4^{th}$ NAND gate 1015 and the $1^{st}$ inverter 1013, and a $7^{th}$ NAND gate 1018 performing an NAND operation by receiving an output signal of the $6^{th}$ NAND gate 1017 and outputting an output signal to the $2^{nd}$ NAND gate 1012. A $8^{th}$ NAND gate 1019, which is cross-coupled with the $7^{th}$ NAND gate 1018, performs a NAND operation by receiving an output signal of the $5^{th}$ NAND gate 1016 and outputs an output signal to the $1^{st}$ NAND gate 1011.

A second divider 1020 receives the first divided signal A form the first divider 1010 and generates a second dividing signal B-1 by inverting a signal logic level when the first divided signal A is a second logic level (high) and maintaining a latched value when the first divided signal A is a first logic level (low). The second divided signal A is outputted to a selector 1030.

An operation of the second divider 1020 will be described in detail.

In the second divider 1020, a $9^{th}$ NAND gate 1021 performs a NAND operation by receiving the first divided signal, and a $10^{th}$ NAND gate 1022 for performing a NAND operation by receiving the first divided signal. A $2^{nd}$ inverter 1023 inverts the first divided signal, and a $11^{th}$ NAND gate 1024 performs a NAND operation by receiving an output signal of the $10^{th}$ NAND gate 1022. A $12^{th}$ NAND gate 1025, which is cross-coupled with the $11^{th}$ NAND gate 1024, outputs the second divided signal B-1 by performing a NAND operation for an output signal of the $9^{th}$ NAND gate 1021.

A $13^{th}$ NAND gate 1026 performs a NAND operation by receiving output signals of the $11^{th}$ NAND gate 1024 and the $2^{nd}$ inverter 1023, and a $14^{th}$ NAND gate 1027 performs a NAND operation by receiving output signals of the $12^{th}$ NAND gate 1025 and the $2^{nd}$ inverter 1023. A $15^{th}$ NAND gate 1028 performs an NAND operation by receiving an output signal of the $14^{th}$ NAND gate 1027 and outputs its output signal to the $10^{th}$ NAND gate 1022, and a $16^{th}$ NAND gate 1029, which is cross-coupled with the $15^{th}$ NAND gate 1028, performs a NAND operation by receiving an output signal of the $13^{th}$ NAND gate 1026 and outputs its output signal to the $9^{th}$ NAND gate 1020.

The selector 1030 includes a first pass gate 1031 for passing the second divided signal B-1 to a third divider 1040 when the control signal CL is the first logic level (low), and for breaking the second divided signal when the control signal is the second logic level (high), and a second pass gate for passing a third divided signal B-2 to the third divider when the control signal is the second logic level (high), and for breaking the second divided signal when the control signal is the first logic level (low).

A third divider 1040 receives the second divided signal B-1 or the third divided signal B-2 from the selector 1030 and generates a reference signal S3 by inverting a signal logic level when the second divided signal B-1 or the third divided signal B-2 is a second logic level (high) and maintaining a latched value when the second divided signal B-1 or the third divided signal B-2 is a first logic level (low). The second divided signal A is outputted to the phase comparator 930.

An operation of the third divider 1040 will be described in detail.

In the third divider 1040, a $17^{th}$ NAND gate 1041 performs a NAND operation by receiving an output signal of the selector 1030, and a $18^{th}$ NAND gate 1042 performs a NAND operation by receiving the output signal of the selector. A $3^{rd}$ inverter 1043 inverts the output signal of the selector 1030, and a $19^{th}$ NAND gate 1044 performs a NAND operation by receiving an output signal of the $18^{th}$ NAND gate 1042.

A $20^{th}$ NAND gate 1045, which is cross-coupled with the $19^{th}$ NAND gate 1044, performs a NAND operation for an output signal of the $17^{th}$ NAND gate 1041, and a $21^{st}$ NAND gate 1046 performs a NAND operation by receiving output signals of the $19^{th}$ NAND gate 1044 and the $3^{rd}$ inverter 1043. A $22^{nd}$ NAND gate 1047 performs a NAND operation by receiving output signals of the $20^{th}$ NAND gate 1045 and the $3^{rd}$ inverter 1043 and outputs a reference signal S3. A $23^{rd}$ NAND gate 1048 performs an NAND operation by receiving an output signal of the $22^{nd}$ NAND gate 1047 and outputs an output signal to the $18^{th}$ NAND gate 1042, and a 24th NAND gate 1049, which is cross-coupled with the 23rd NAND gate 1048, performing a NAND operation by receiving an output signal of the 21st NAND gate 1046 and outputs its output signal to the 17th NAND gate 1041.

The driver 1050 outputs a inverted reference signal S2 to the plurality of delay lines 961 to 963 by receiving and inverting the reference signal S3 from the third divider 1040.

Figure 11:
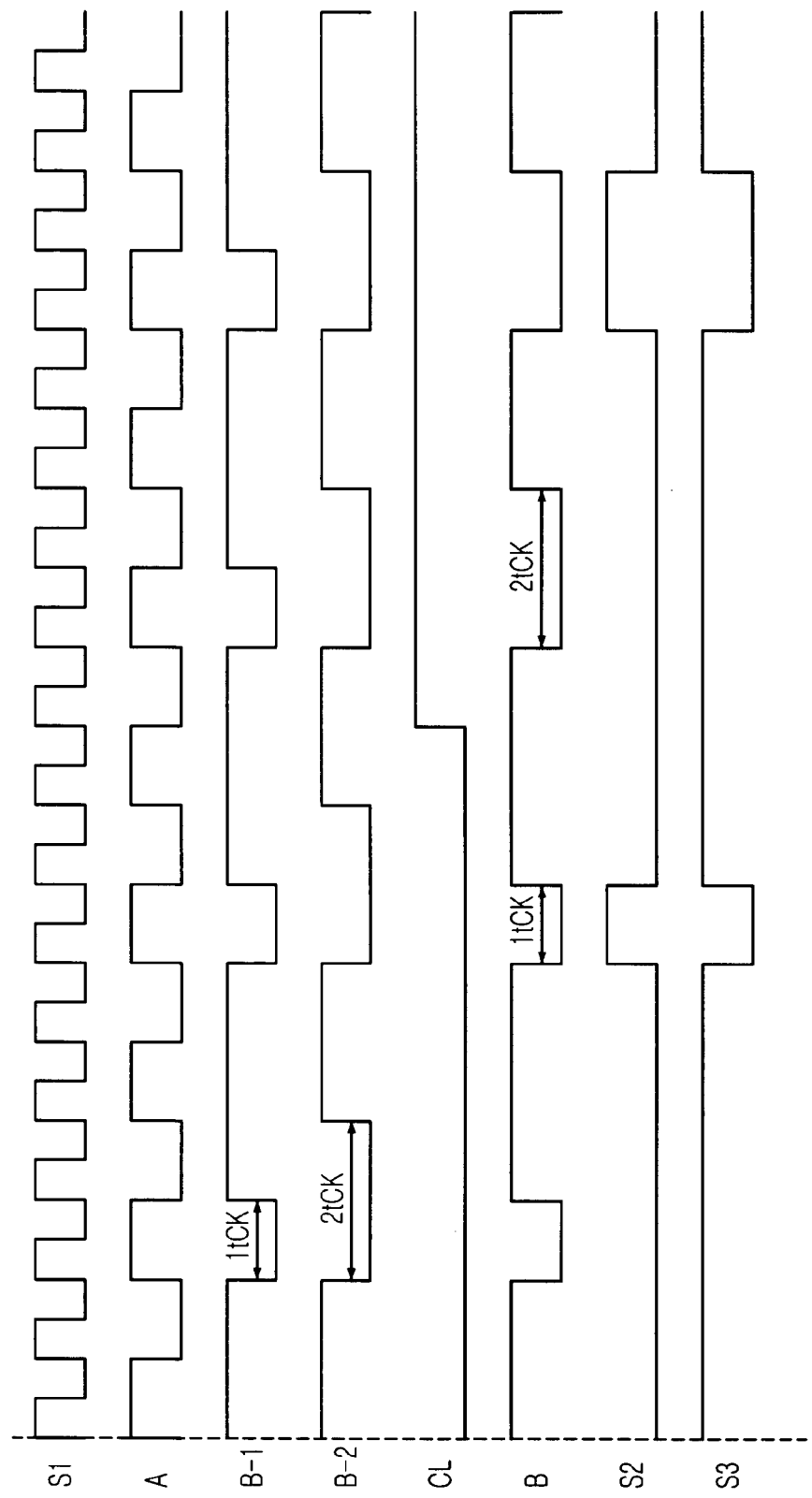
FIG. 11 is a timing diagram illustrating an operation of the delay locked loop in accordance with the preferred embodiment of the present invention.

FIG. 11 is a timing diagram illustrating an operation of the delay locked loop in accordance with the preferred embodiment of the present invention.

As shown, the first divider 1010 outputs the first divided signal A by receiving the second clock signal Rise_clk and the second divider 1020 outputs the second divided signal B-1 and the third divided signal B-2 by receiving the first divided signal A. The selector 1030 selectively passes the second divided signal B-1 and the third divided signal B-2 to the third divider 1040. The third divider 1040 outputs the reference signal S3 and the inverted reference signal S2.

Since the clock divider suitable for a corresponding frequency is selected by using a column address strobe (CAS) latency in the delay locked loop (DLL) circuit, the DLL can be used to high and low frequencies. Also, a locking time can be reduced.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) block to generate a delay locked clock signal by delaying an external clock signal in a semiconductor device, comprising:
    a clock buffer to receive the external clock signal and an inverted signal of the external clock signal to generate a plurality of internal clock signals;
    a clock divider to receive one of the internal clock signals and a control signal based on a column address strobe (CAS) signal to generate a plurality of divided signals, each having a predetermined pulse width adjusted by the control signal, and output a selected divided signal as the divided signal; and
    a DLL circuit to receive the plurality of internal clock signals and the divided signal to generate the delay locked clock signal,
    wherein the clock divider includes:
    a first divider to receive the one of the internal clock signals to generate a first divided signal having a first pulse width and a first period;
    a second divider to receive the first divided signal to generate a second divided signal having the first pulse width and a second period and a third divided signal having a second pulse width and the second period;
    a selector to selectively output the second divided signal and the third divided signal according to the control signal; and
    a third clock divider to receive an output of the selector to generate the divided signal.

2. The DLL block as recited in claim 1, wherein the DLL circuit includes:
    a plurality of delay lines, each delay line having a plurality of unit delays, to delay the plurality of internal clock signals and the divided signal;
    a delay model to delay an output of the plurality of delay lines for a predetermined delay time to generate a feedback signal;
    a phase comparator to compare a phase of a reference clock signal generated by the clock divider with a phase of the feedback signal to generate a comparison signal, wherein the reference clock signal is an inverted version of the divided signal;
    a shift controller to generate a shift right signal or a shift left signal according to the comparison signal; and
    a shift register to adjust delay amount of the delay lines in response to the shift right signal or the shift left signal.

3. The DLL block as recited in claim 1, wherein the first divider includes:
    a 1st NAND gate to perform a NAND operation by receiving the one of the internal clock signals;
    a 2nd NAND gate to perform a NAND operation by receiving the one of the internal clock signals;
    a 1st inverter to invert one of the internal clock signals;
    a 3rd NAND gate to perform a NAND operation by receiving an output signal of the 2nd NAND gate;
    a 4th NAND gate, which is cross-coupled with the 3rd NAND gate, to output the first divided signal by performing a NAND operation for an output signal of the 1st NAND gate;
    a 5th NAND gate to perform a NAND operation by receiving output signals of the 3rd NAND gate and the 1st inverter;
    a 6th NAND gate to perform a NAND operation by receiving output signals of the 4th NAND gate and the 1st inverter;
    a 7th NAND gate to perform a NAND operation by receiving an output signal of the 6th NAND gate and outputting an output signal to the 2nd NAND gate; and
    a 8th NAND gate, which is cross-coupled with the 7th NAND gate, to perform a NAND operation by receiving an output signal of the 5th NAND gate and outputting an output signal to the 1st NAND gate.

4. The DLL block as recited in claim 3, wherein the second divider includes:
    a 9th NAND gate to perform a NAND operation by receiving the first divided signal;
    a 10th NAND gate to perform a NAND operation by receiving the first divided signal;
    a 2nd inverter to invert the first divided signal;
    a 11th NAND gate to perform a NAND operation by receiving an output signal of the 10th NAND gate;
    a 12th NAND gate, which is cross-coupled with the 11th NAND gate, to output the second divided signal by performing a NAND operation for an output signal of the 9th NAND gate;
    a 13th NAND gate to perform a NAND operation by receiving output signals of the 11th NAND gate and the 2nd inverter;
    a 14th NAND gate to perform a NAND operation by receiving output signals of the 12th NAND gate and the 2nd inverter;
    a 15th NAND gate to perform a NAND operation by receiving an output signal of the
    14th NAND gate and outputting an output signal to the 10th NAND gate; and
    a 16th NAND gate, which is cross-coupled with the 15th NAND gate, to perform a NAND operation by receiving an output signal of the 13th NAND gate and outputting an output signal to the 9th NAND gate.

5. The DLL block as recited in claim 1, wherein the selector includes:
    a first pass gate to pass the second divided signal to the second clock divider when the control signal is in a first logic level; and a second pass gate to pass the third divided signal to the second clock divider when the control signal is in a second logic level.

6. The DLL block as recited in claim 4, wherein the third divider includes:
- a 17th NAND gate to perform a NAND operation by receiving an output signal of the selector;
- a 18th NAND gate to perform a NAND operation by receiving the output signal of the selector;
- a 3rd inverter to invert the output signal of the selector;
- a 19th NAND gate to perform a NAND operation by receiving an output signal of the 18th NAND gate;
- a 20th NAND gate, which is cross-coupled with the 19th NAND gate, to perform a NAND operation for an output signal of the 17th NAND gate;
- a 21st NAND gate to perform a NAND operation by receiving output signals of the 19th NAND gate and the 3rd inverter;
- a 22nd NAND gate to perform a NAND operation by receiving output signals of the 20th NAND gate and the 3rd inverter and outputting a reference signal;
- a 23rd NAND gate to perform an NAND operation by receiving an output signal of the 22nd NAND gate and outputting an output signal to the 18th NAND gate; and
- a 24th NAND gate, which is cross-coupled with the 23rd NAND gate, to perform a NAND operation by receiving an output signal of the 21st NAND gate and outputting an output signal to the 17th NAND gate.

* * * * *